United States Patent
Oh et al.

(10) Patent No.: US 10,264,670 B2
(45) Date of Patent: Apr. 16, 2019

(54) STRUCTURE FOR FLEXIBLE PRINTED CIRCUIT BOARDS

(71) Applicant: LG DISPLAY CO., LTD., Seoul (KR)

(72) Inventors: Ducksu Oh, Daejeon (KR); Sung Soo Park, Daejeon (KR); Minsoo Kang, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/942,913

(22) Filed: Apr. 2, 2018

(65) Prior Publication Data

US 2018/0249574 A1   Aug. 30, 2018

Related U.S. Application Data

(63) Continuation of application No. 14/904,551, filed as application No. PCT/KR2014/006732 on Jul. 24, 2014, now Pat. No. 9,974,164.

(30) Foreign Application Priority Data

Jul. 24, 2013 (KR) .................. 10-2013-0087522

(51) Int. Cl.
| | |
|---|---|
| *H05K 5/00* | (2006.01) |
| *H05K 7/00* | (2006.01) |
| *H05K 1/18* | (2006.01) |
| *H05K 1/02* | (2006.01) |
| *H05K 1/11* | (2006.01) |
| *H05K 1/14* | (2006.01) |
| *H05K 3/36* | (2006.01) |

(Continued)

(52) U.S. Cl.
CPC ............. *H05K 1/028* (2013.01); *H05K 1/118* (2013.01); *H05K 1/14* (2013.01); *H05K 1/142* (2013.01); *H05K 3/361* (2013.01); *H01L 27/3276* (2013.01); *H05K 1/111* (2013.01); *H05K 1/117* (2013.01); *H05K 1/141* (2013.01); *H05K 1/145* (2013.01); *H05K 1/147* (2013.01); *H05K 1/189* (2013.01); *H05K 3/323* (2013.01); *H05K 3/363* (2013.01); *H05K 2201/0397* (2013.01); *H05K 2201/046* (2013.01); *H05K 2201/05* (2013.01); *H05K 2201/058* (2013.01); *H05K 2201/09418* (2013.01); *H05K 2201/10128* (2013.01); *H05K 2201/10681* (2013.01); *H05K 2203/049* (2013.01)

(58) Field of Classification Search
CPC ..... H05K 2201/05; H05K 2201/10681; H05K 1/147; H05K 1/111; H05K 1/117; H05K 1/14; H05K 1/141; H05K 1/142; H05K 1/145; H05K 2201/046; H05K 1/118
USPC ................. 361/749, 767, 777, 784, 792; 349/149–152
See application file for complete search history.

(56) References Cited

U.S. PATENT DOCUMENTS

| | | |
|---|---|---|
| 2004/0262605 A1 | 12/2004 | Park et al. |
| 2008/0170196 A1 | 7/2008 | Ebine |

(Continued)

FOREIGN PATENT DOCUMENTS

| | | |
|---|---|---|
| CN | 203038925 U | 7/2013 |
| JP | 3-17627 A | 1/1991 |

(Continued)

*Primary Examiner* — Binh B Tran
(74) *Attorney, Agent, or Firm* — Dentons US LLP

(57) ABSTRACT

A flexible printed circuit board installed on a substrate in a display device is provided.

12 Claims, 10 Drawing Sheets

(51) Int. Cl.
  *H01L 27/32* (2006.01)
  *H05K 3/32* (2006.01)

(56) References Cited

U.S. PATENT DOCUMENTS

| | | | |
|---|---|---|---|
| 2009/0040415 A1* | 2/2009 | Kim | G02F 2001/133612 |
| | | | 349/56 |
| 2009/0184626 A1 | 7/2009 | Kim et al. | |
| 2009/0184627 A1 | 7/2009 | Kim et al. | |
| 2010/0304580 A1 | 12/2010 | Baycura | |
| 2012/0044221 A1 | 2/2012 | Ko et al. | |
| 2013/0093308 A1* | 4/2013 | Kagotani et al. | ........................... |
| | | | H01L 2251/5361 |
| | | | 313/45 |

FOREIGN PATENT DOCUMENTS

| | | |
|---|---|---|
| JP | 05-152703 A | 6/1993 |
| JP | 09-127540 A | 5/1997 |
| JP | 2004-327925 A | 11/2004 |
| JP | 2005-093890 A | 4/2005 |
| JP | 2005-173579 A | 6/2005 |
| JP | 2006-228455 A | 8/2006 |
| JP | 2007-299740 A | 11/2007 |
| JP | 2008-078520 A | 4/2008 |
| KR | 10-2002-0069675 A | 9/2002 |
| KR | 10-2005-0051460 A | 6/2005 |
| KR | 10-0907414 B1 | 7/2009 |
| KR | 10-0907415 B1 | 7/2009 |
| KR | 10-2012-0057712 A | 6/2012 |
| KR | 10-2013-0059871 A | 6/2013 |
| WO | 2011/136262 A1 | 11/2011 |

* cited by examiner

STRUCTURE FOR FLEXIBLE PRINTED CIRCUIT BOARDS

This application is a Continuation of application Ser. No. 14/904,551, filed on Jan. 12, 2016, which was a national stage entry of PCT/KR2014/006732, filed Jul. 24, 2014, and claims the benefit of and priority to Korean Patent Application No. 10-2013-0087522, filed on Jul. 24, 2013, which are hereby incorporated by reference for all purposes as if fully set forth herein.

TECHNICAL FIELD

The present invention relates to a structure of a flexible printed circuit board installed on a substrate in a display device.

BACKGROUND ART

A flexible printed circuit board is an electronic component that is developed as electronic products become miniaturized and light-weighted, and has excellent workability, heat resistance, bendability, and chemical resistance. The flexible printed circuit board has a strong resistance against heat, and has been widely used as a core component of every electronic product, such as an organic light emitting diode, a camera, a computer and peripheral devices, a cellular phone, a video/audio device, a camcorder, a printer, a DVD, a TFT LCD, satellite equipment, military equipment, or medical equipment.

In the display device, the flexible printed circuit board for power supply serves to connect a power supply portion and pixel portions to each other so that a power is supplied from the power supply portion to the respective pixel portions. In the display device, two or more flexible printed circuit boards are arranged on outer sides of the pixel portions, and anodes and cathodes are conducted group by group to connect the power supply portion to the respective pixel portions.

In this case, in order to efficiently supply the power, it is important to adjust the shape and the arrangement structure of the flexible printed circuit board.

DISCLOSURE

Technical Problem

The present invention provides a structure of a flexible printed circuit board installed on a substrate in a display device.

Technical Solution

According to one aspect of the present invention, there is provided a structure of a flexible printed circuit board, which includes: a substrate; two or more flexible printed circuit boards positioned at edges on the substrate and mounted with anode pads and cathode pads; and at least one of a soldering portion and a wire bonding portion which respectively make the anode pads and the cathode pads mounted on neighboring end portions of the flexible printed circuit boards conduct electricity.

Advantageous Effects

In accordance with the present invention, since an additional configuration, such as an equipotential flexible printed circuit board, is not required when the two or more flexible printed circuit boards are connected, the process can be simplified, and the manufacturing costs can be saved.

MODE FOR INVENTION

Hereinafter, the present invention will be described in detail.

Figure 1:
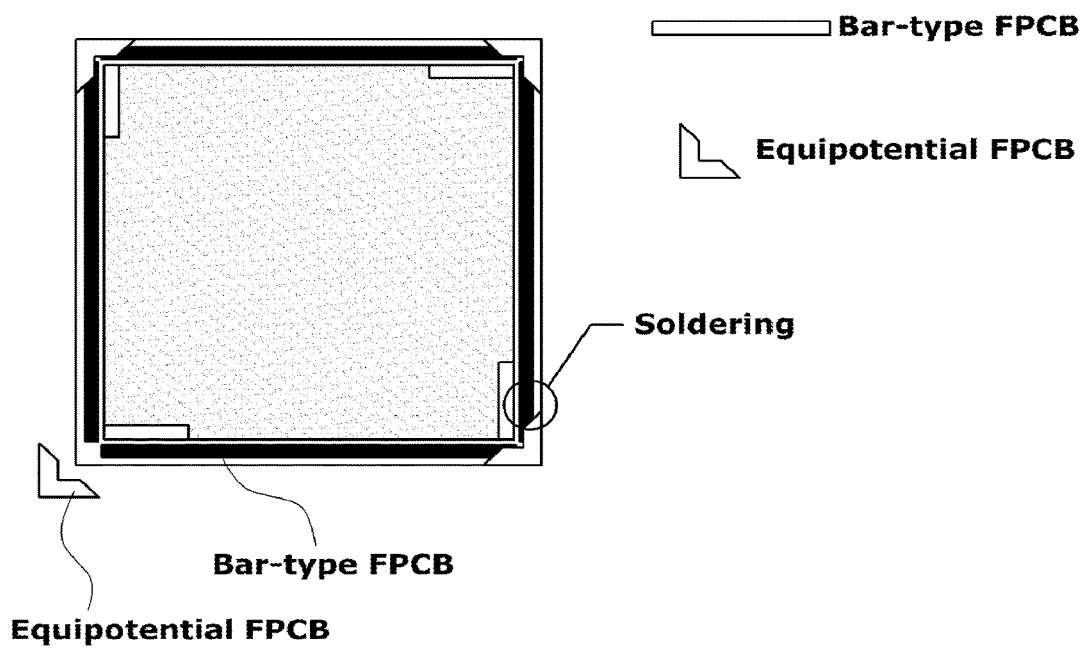
FIG. 1 is a diagram illustrating a structure that makes two or more flexible printed circuit boards conduct electricity in the related art.

As illustrated in FIG. 1, in the related art, two or more flexible printed circuit boards are installed on a substrate, and equipotential flexible printed circuit boards are installed and soldered in end portions of the flexible printed circuit boards that are spaced apart from each other to make the flexible printed circuit boards conduct electricity. The above-described method has been used to secure allowable current when the flexible printed circuit boards that are spaced apart from each other conduct electricity with each other.

In accordance with the present invention, when two or more flexible printed circuit boards are connected, they conduct electricity without an equipotential flexible printed circuit board, and thus a process of installing the equipotential flexible printed circuit board can be omitted. Accordingly, the process can be simplified to improve productivity.

Further, the costs for providing components of the equipotential flexible printed circuit board can be saved.

The present invention relates to a structure of a flexible printed circuit board that makes two or more flexible printed circuit boards conduct electricity without an equipotential flexible printed circuit board when the flexible printed circuit boards are connected, a method for manufacturing the same, and an organic light emitting diode including the same.

The present invention relates to a structure of a flexible printed circuit board that makes two or more flexible printed circuit boards, which are arranged to overlap each other or to be spaced apart from each other regardless of an equipotential flexible printed circuit board, conduct electricity through at least one of a soldering portion and a wire bonding portion when the flexible printed circuit boards are connected to each other.

In accordance with an embodiment of the present invention, there is provided a structure of a flexible printed circuit board, which includes a substrate; two or more flexible printed circuit boards positioned at edges on the substrate and mounted with anode pads and cathode pads; and at least one of a soldering portion and a wire bonding portion which respectively make the anode pads and the cathode pads mounted on neighboring end portions of the flexible printed circuit boards conduct electricity.

In accordance with the present invention, the term "edge on the substrate" means a border or an outer portion of one surface of the substrate.

In accordance with the present invention, the term "neighboring" means that one flexible printed circuit board and another flexible printed circuit board are located close to each other, and includes overlapping each other (i.e., piled up), in contact with each other, and spaced apart from each other.

In accordance with the present invention, the term "mounting" means arrangement of a device or a component on a substrate or a base through attachment so that the device or the component is to be actually usable.

In accordance with the present invention, the flexible printed circuit board may include an insulating film base; an anode portion and a cathode portion mounted on the insulating film base; and an anode pad and a cathode pad mounted in parallel on end portions of both sides of the insulating film base.

In this case, the anode pad and the cathode pad mounted on the end portions of both sides of the insulating film base means a pair of anode and cathode pads mounted on one end portion of the insulating film base and a separate pair of anode and cathode pads mounted on the other end portion of the insulating film base.

Figure 2:
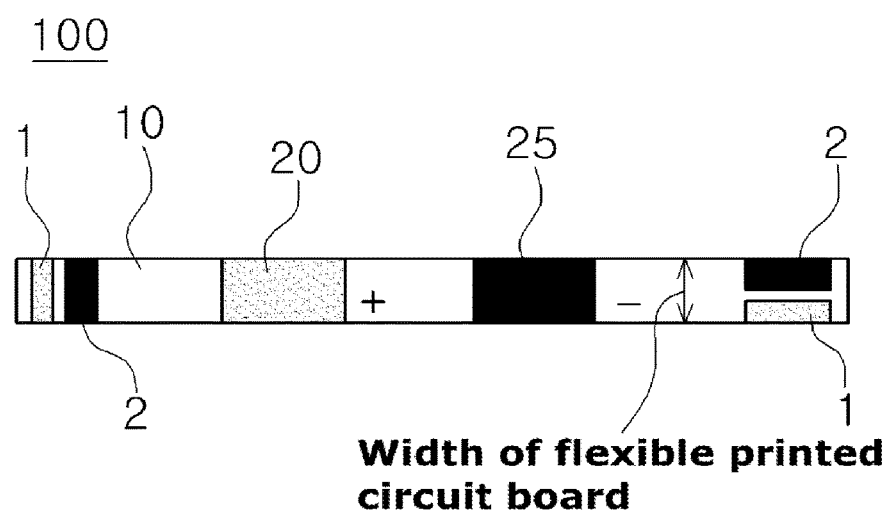
FIG. 2 is a diagram illustrating a flexible printed circuit board in accordance with an embodiment of the present invention.

Referring to FIG. 2, the flexible printed circuit board 100 may include an insulating film base 10; an anode portion 20 and a cathode portion 25 mounted on the insulating film base; and an anode pad 1 and a cathode pad 2 mounted in parallel on end portions of both sides of the insulating film base 10.

The soldering portion means a portion that is formed by soldering, and the wire bonding portion means a portion that is formed by wire bonding.

The soldering method may be a typical method that is known in the art, but is not limited thereto.

The wire bonding method may be a typical method that is known in the art, but is not limited thereto.

In accordance with the present invention, the two or more flexible printed circuit boards may not overlap each other. That is, the two or more flexible printed circuit boards may not be piled up.

In accordance with the present invention, the two or more flexible printed circuit boards may be spaced apart from each other. That is, the two or more flexible printed circuit boards may be distant from each other at a predetermined interval.

In this case, a gap distance between the flexible printed circuit boards may be longer than 0 mm and equal to or shorter than 1 mm.

Figure 4:
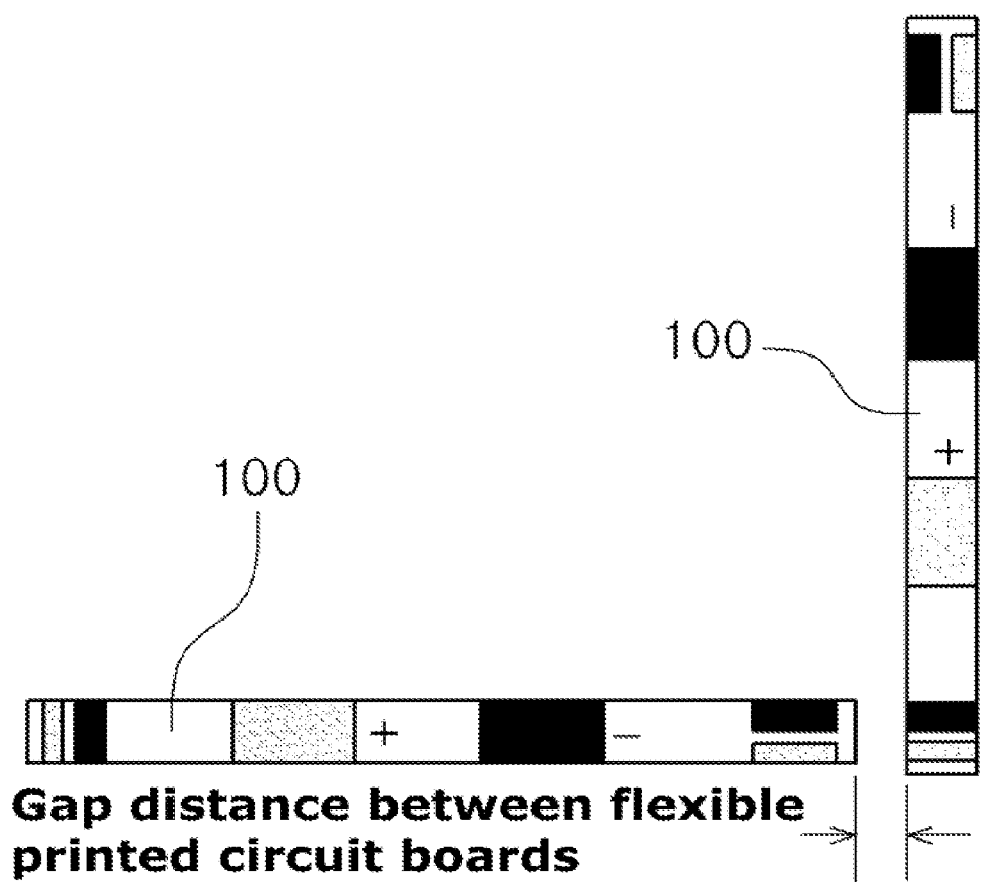
FIG. 4 is a diagram illustrating a gap distance between flexible printed circuit boards.

As illustrated in FIG. 4, the gap distance between the flexible printed circuit boards means a distance measured between the close end portions.

In accordance with the present invention, the flexible printed circuit board may be a bar-type flexible printed circuit board.

In accordance with the present invention, the two or more flexible printed circuit boards may include four bar-type flexible printed circuit boards.

In accordance with the present invention, in the case where the substrate is rectangular, one bar-type flexible printed circuit board for one side may be arranged at an edge, that is, a border, on the substrate. In this case, total four bar-type flexible printed circuit boards may be installed on respective sides of the substrate.

In this case, end portions of the flexible printed circuit boards installed on four sides of the rectangular substrate may be arranged to overlap each other or to be spaced apart from each other.

In accordance with the present invention, the width of the flexible printed circuit board may be 1 to 5 mm.

In accordance with the present invention, the "width" means a length in a direction that is perpendicular to the length direction, that is, a length in the width direction.

In accordance with the present invention, the anode pads and the cathode pads that are positioned on the end portions of the flexible printed circuit board may be mounted in parallel to each other. In this case, the direction in which the anode pads and the cathode pads are mounted is not specially limited so far as the anode pads and the cathode pads are positioned on the end portions of the flexible printed circuit board in parallel to each other.

In accordance with the present invention, the anode pads and the cathode pads that are positioned on the end portions of both sides of the flexible printed circuit board may be mounted in parallel to each other. In this case, the direction in which the anode pad and the cathode pad that are positioned on the end portion of one side are mounted and the direction in which the anode pad and the cathode pad that are positioned on the end portion of the other side are mounted may coincide with each other or may be different from each other.

In accordance with the present invention, the anode pad and the cathode pad that are mounted in parallel to each other on the end portion of any one of the two or more flexible printed circuit boards and the anode pad and the cathode pad that are mounted in parallel to each other on the end portions of another neighboring flexible printed circuit board may respectively conduct electricity through at least one of the soldering portion and the wire bonding portion.

In accordance with the present invention, the anode pad and the cathode pad that are positioned on the end portion of one side of the flexible printed circuit board may be mounted in parallel to each other in the length direction of the flexible printed circuit board, and the anode pad and the cathode pad that are positioned on the end portion of the other side of the flexible printed circuit board may be mounted in parallel to each other in a direction that is perpendicular to the length direction of the flexible printed circuit board.

As illustrated in FIG. 2, the anode pad 1 and the cathode pad 2 that are positioned on the end portion of one side of the flexible printed circuit board 100 may be mounted in parallel to each other in the length direction of the flexible printed circuit board 100, and the anode pad 1 and the cathode pad 2 that are positioned on the end portion of the other side of the flexible printed circuit board 100 may be mounted in parallel to each other in a direction that is perpendicular to the length direction of the flexible printed circuit board 100.

In accordance with the present invention, the anode pad and the cathode pad that are mounted in the length direction of the flexible printed circuit board on the end portion of any one of the two or more flexible printed circuit boards and the anode pad and the cathode pad that are mounted in a direction that is perpendicular to the length direction of the flexible printed circuit board on the end portions of another neighboring flexible printed circuit board may respectively conduct electricity through at least one of the soldering portion and the wire bonding portion.

Figure 5:
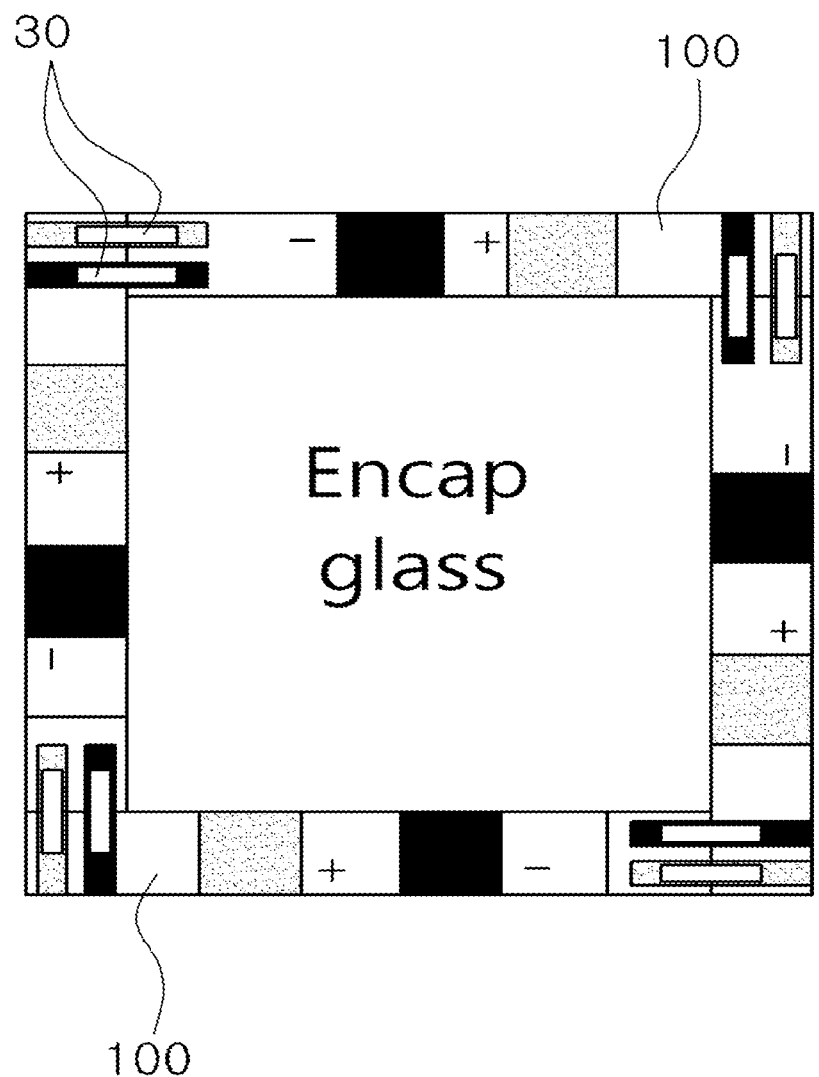
FIG. 5 is a diagram illustrating a structure of a flexible printed circuit board in accordance with an embodiment of the present invention.

As illustrated in FIG. 5, the anode pad and the cathode pad that are mounted in the length direction of the flexible printed circuit board 100 on the end portion of any one of the two or more flexible printed circuit boards and the anode pad and the cathode pad that are mounted in a direction that is perpendicular to the length direction of the flexible printed circuit board on the end portions of another neighboring flexible printed circuit board may respectively conduct electricity through at least one of the soldering portion and the wire bonding portion 30.

In accordance with the present invention, the width of the soldering portion may be 0.1 to 2 mm.

In accordance with the present invention, the soldering portion may include any one of brass solder, silver solder, german silver solder, manganese solder, gold solder, a lead-tin alloy, a lead-tin-zinc alloy, a lead-cadmium alloy, zinc-cadmium solder and a lead-tin-bismuth-based alloy.

In accordance with the present invention, the wire bonding portion may include a wire having a diameter of 0.1 to 2 mm.

In accordance with the present invention, the structure of the flexible printed circuit board may further include an anisotropic conductive film positioned between the substrate and the flexible printed circuit board to correspond to the flexible printed circuit board.

More specifically, in accordance with an embodiment of the present invention, there is provided a structure of a flexible printed circuit board, which includes a substrate; an anisotropic conductive film positioned at an edge on the substrate; flexible printed circuit boards positioned on the anisotropic conductive film; and at least one of a soldering portion and a wire bonding portion which respectively make anode pads and cathode pads mounted on neighboring end portions of the flexible printed circuit boards conduct electricity.

In accordance with another embodiment of the present invention, there is provided a structure of a flexible printed circuit board, which includes a substrate; a pair of lower flexible printed circuit boards facing each other at edges on the substrate and mounted with anode pads and cathode pads; and a pair of upper flexible printed circuit boards facing each other at the edges on the substrate to partially overlap the lower flexible printed circuit boards, and mounted with anode pads and cathode pads, wherein the anode pads and the cathode pads of the overlapping upper flexible printed circuit boards and the anode pads and the cathode pads of the lower flexible printed circuit boards respectively conduct electricity by a conductive material which fills a hole formed in a portion of the upper flexible circuit board that overlaps the lower flexible printed circuit board.

In accordance with the present invention, the term "the lower flexible printed circuit board and the upper flexible printed circuit board are positioned to partially overlap each other" means that the lower flexible printed circuit board and the upper flexible printed circuit board overlap each other, and unless the lower flexible printed circuit board and the upper flexible printed circuit board are parallel to each other, the overlapping position is not specially limited. In this case, that the lower flexible printed circuit board and the upper flexible printed circuit board are not parallel to each other means that an acute angle made between the lower flexible printed circuit board and the upper flexible printed circuit board is larger than 0° and equal to or smaller than 90°.

Figure 6:
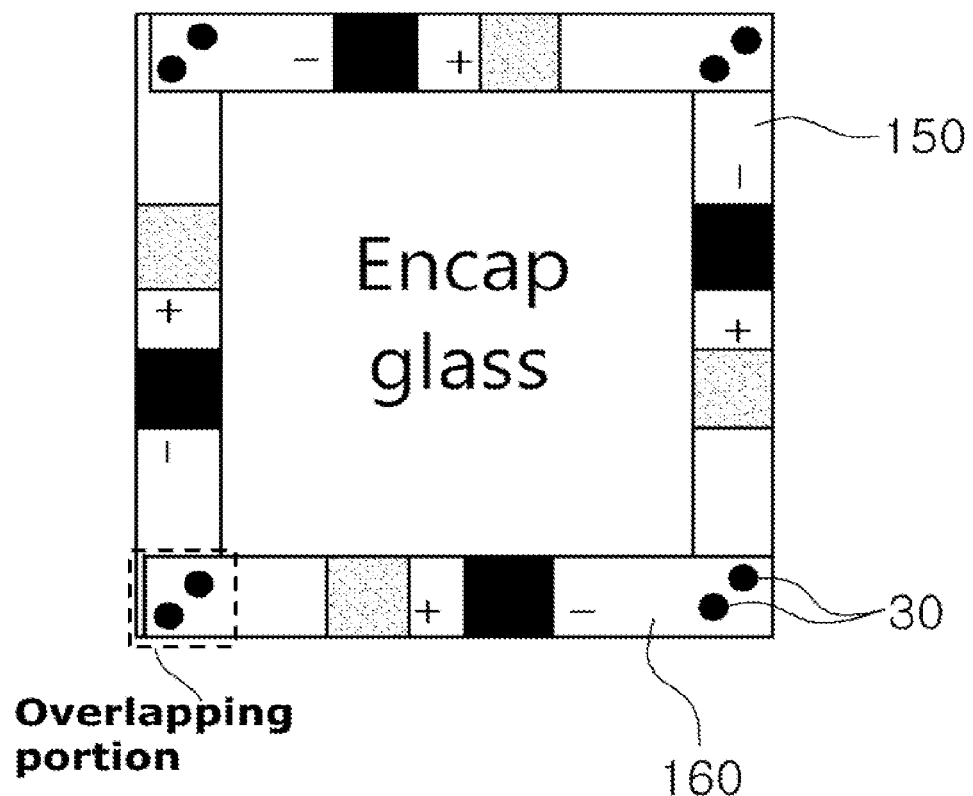
FIG. 6 is a diagram illustrating a structure of a flexible printed circuit board in accordance with another embodiment of the present invention.

Referring to FIG. 6, if the acute angle formed between the lower flexible printed circuit board 150 and the upper flexible printed circuit board 160 is 90°, the structure may be shown as illustrated in FIG. 6. In this case, the anode pad and the cathode pad of the upper flexible printed circuit board and the anode pad and the cathode pad of the lower flexible printed circuit board respectively conduct electricity by a conductive material which fills a hole 50 formed in a portion of the upper flexible printed circuit board 160 that overlaps the lower flexible printed circuit board.

In accordance with the present invention, the term "the anode pad and the cathode pad respectively conduct electricity" means that the anode pads are connected to each other with a conductive material, and the cathode pads are connected to each other with a conductive material, through which current flows.

Specifically, this means that the anode pad of the upper flexible printed circuit board and the anode pad of the lower flexible printed circuit board, which overlap each other, are made to conduct current by the conductive material that fills the hole, and the cathode pad of the upper flexible printed circuit board and the cathode pad of the lower flexible printed circuit board, which overlap each other, are made to conduct current by the conductive material that fills the hole.

The conductive material is not specially limited so far as the conductive material can make current flow without exerting an influence on the flexible printed circuit board and can fill the hole formed in the upper flexible printed circuit board.

In accordance with the present invention, an end portion of the upper flexible printed circuit board may overlap an end portion of the lower flexible printed circuit board.

In accordance with the present invention, the upper flexible printed circuit board and the lower flexible printed circuit board may be bar-type flexible printed circuit boards.

In accordance with the present invention, the width of the upper or lower flexible printed circuit board may be 1 to 5 mm.

In accordance with the present invention, the hole may be respectively formed at the anode pad and the cathode pad of the upper flexible printed circuit board.

In this case, it is preferable that the distance between the hole that is formed at the anode pad and the hole that is formed at the cathode pad becomes longer when the hole is respectively formed at the anode pad and the cathode pad of the upper flexible printed circuit board. Accordingly, the hole that is formed at the anode pad and the hole that is formed at the cathode pad may be in a diagonal form. This means that an angle that is made by a line connected between the center of the hole formed at the anode pad and the center of the hole formed at cathode pad with respect to the length direction of the anode pad or the cathode pad is not right-angled or parallel. More specifically, this means that the acute angle made by the line connected between the center of the hole formed at the anode pad and the center of the hole formed at cathode pad with respect to the length direction of the anode pad or the cathode pad is larger than 0° and equal to or smaller than 90°.

In accordance with the present invention, the diameter of the hole is not specially limited unless short occurs by the conductive material that fills the hole. For example, the diameter of the hole may be equal to or smaller than the width of the anode pad and the cathode pad.

In accordance with the present invention, the distance between the center of the hole of the anode pad and the center of the hole of the cathode pad may be 0.5 to 2 mm.

In accordance with the present invention, the conductive material may include lead. Specifically, the conductive material may fill the hole by soldering.

In accordance with the present invention, the conductive material may be any one of brass solder, silver solder, german silver solder, manganese solder, gold solder, a lead-tin alloy, a lead-tin-zinc alloy, a lead-cadmium alloy, zinc-cadmium solder and a lead-tin-bismuth-based alloy.

In accordance with the present invention, the upper flexible printed circuit board and the lower flexible printed circuit board may have a multilayer structure including two or more layers.

In accordance with the present invention, if the upper flexible printed circuit board has a multilayer structure including two or more layers, the uppermost layer of the upper flexible printed circuit board may be installed to extend in the length direction of the upper flexible printed circuit board, and may be positioned so that an end portion of the uppermost layer of the upper flexible printed circuit board overlaps the lower flexible printed circuit board.

In accordance with the present invention, if the upper flexible printed circuit board and the lower flexible printed circuit board have a multilayer structure including two or more layers, the uppermost layer of the flexible printed circuit board serves as an electrode portion that transfers the power from an outside to a light emitting portion.

In accordance with the present invention, if the upper flexible printed circuit board and the lower flexible printed circuit board have a multilayer structure including three or more layers, the uppermost layer of the flexible printed circuit board serves as an electrode portion that transfers the power from an outside to a light emitting portion, an intermediate layer of the flexible printed circuit board serves to make the same electrodes that are spaced apart from each other equipotential, and the lowermost layer of the flexible printed circuit board is combined with the electrode of the light emitting portion through the anisotropic conductive film to transfer the power that is supplied from the uppermost layer of the flexible printed circuit board to the light emitting portion.

The material of the flexible printed circuit board may be a general material in the art, and is not specially limited. For example, a line that is obtained by plating gold (Au) onto copper (Cu) may be used as a circuit line, and the circuit line is insulated from an outside using a polyimide film to conduct electricity.

In accordance with the present invention, the term "uppermost layer" means a layer that is positioned relatively far from the substrate, the term "lowermost layer" means a layer that is positioned relatively close to the substrate, and the term "intermediate layer" means a layer that is positioned between the uppermost layer and the lowermost layer.

Figure 9:
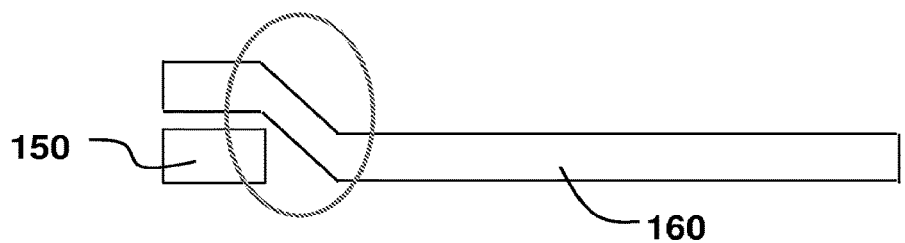
FIG. 9 is a diagram illustrating a portion in which a lower flexible printed circuit board and an upper flexible printed circuit board overlap each other.

If the upper flexible printed circuit board overlaps the lower flexible printed circuit board, as illustrated in FIG. 9, the upper flexible printed circuit board is bent, and thus the indicated portion may be damaged.

Figure 10:
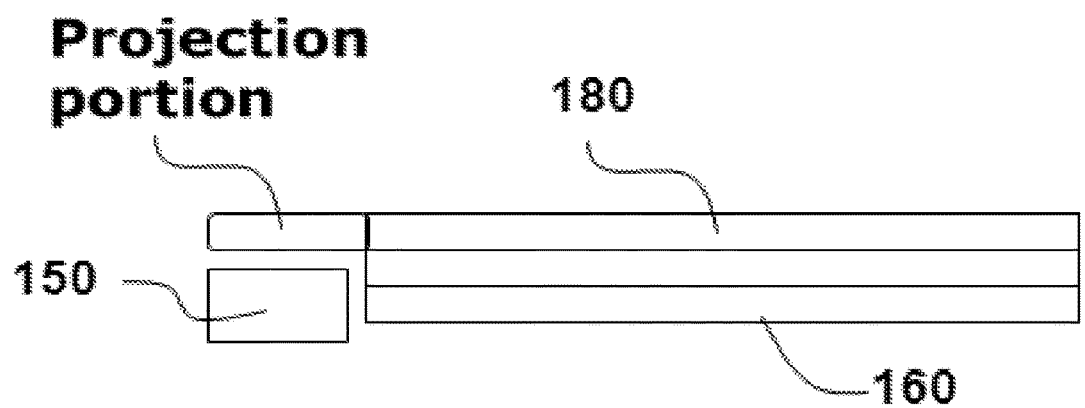
FIG. 10 is a diagram illustrating a portion in which a lower flexible printed circuit board and an upper flexible printed circuit board of a multilayer structure overlap each other.

In this case, as illustrated in FIG. 10, the upper flexible printed circuit board may have a multilayer structure, the uppermost layer 180 of the upper flexible printed circuit board may extend in the length direction of the upper flexible printed circuit board to form a protrusion, and the end portion (i.e., protrusion) of the uppermost layer 180 of the upper flexible printed circuit board may overlap the lower flexible printed circuit board 150.

In accordance with the present invention, the hole may be respectively formed at the anode pad and the cathode pad formed on the end portion of the uppermost layer of the upper flexible printed circuit board having the multilayer structure.

In accordance with the present invention, the flexible printed circuit board may further include an anisotropic conductive film positioned between the substrate and the flexible printed circuit board to correspond to the flexible printed circuit board.

In accordance with other embodiment of the present invention, there is provided a flexible printed circuit board on which an anode lead terminal and a cathode lead terminal are installed to protrude from at least one end portion thereof in the length direction of the flexible printed circuit board.

Figure 3:
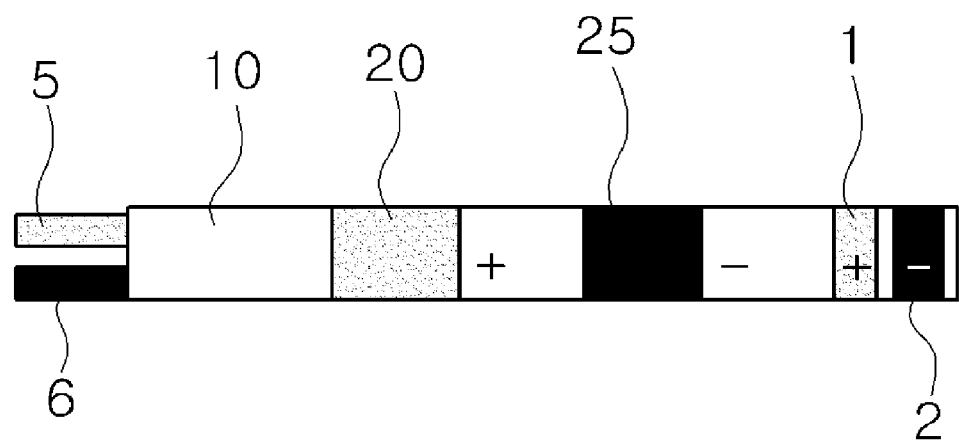
FIG. 3 is a diagram illustrating a flexible printed circuit board in accordance with another embodiment of the present invention.

Referring to FIG. 3, the flexible printed circuit board 100 may include an insulating film base material 10; an anode portion 20 and a cathode portion 25 mounted on the insulating film base material 10; an anode pad 1 and a cathode pad 2 mounted in parallel to each other on an end portion of one side of the insulating film base material 10; and an anode lead terminal 5 and a cathode lead terminal 6 protruding in a length direction of the flexible printed circuit board.

In accordance with the present invention, there is provided a structure of a flexible printed circuit board, which includes a substrate; and two or more flexible printed circuit boards positioned at edges on the substrate, wherein an anode lead terminal and a cathode lead terminal are installed on an end portion of one side of the flexible printed circuit board to protrude in a length direction of the flexible printed circuit board, an anode pad and a cathode pad are mounted on an end portion of the other side of the flexible printed circuit board, and the anode lead terminal and the cathode lead terminal of any one of the flexible printed circuit boards correspondingly overlap the anode pad and the cathode pad of the end portion of another neighboring flexible printed circuit boards to conduct electricity with each other through a conductive material.

Figure 7:
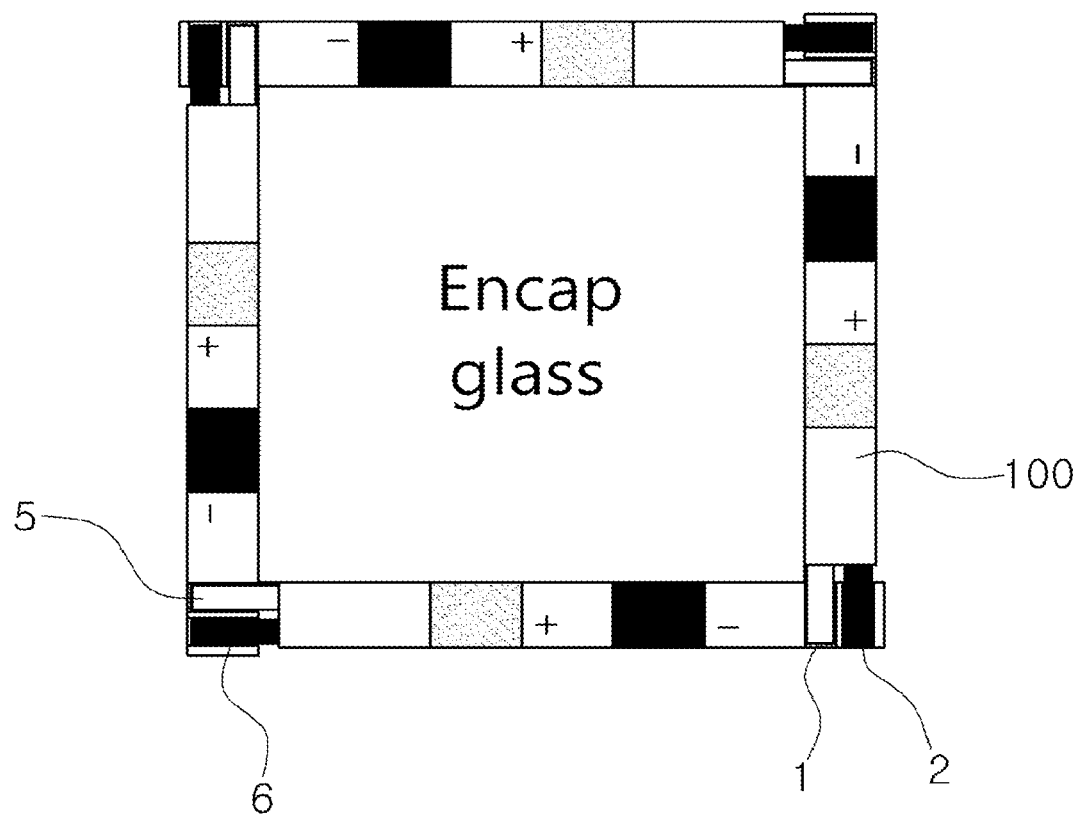
FIG. 7 is a diagram illustrating a structure of a flexible printed circuit board in accordance with other embodiment of the present invention.

As illustrated in FIG. 7, an anode lead terminal 5 and a cathode lead terminal 6 may be installed on an end portion of one side of the flexible printed circuit board 100 to protrude in the length direction of the flexible printed circuit board, an anode pad 1 and a cathode pad 2 may be mounted on an end portion of the other side of the flexible printed circuit board, and the anode lead terminal 5 and the cathode lead terminal 6 of any one of the flexible printed circuit boards overlap the anode pad 1 and the cathode pad 2 of the end portion of another neighboring flexible printed circuit boards to conduct electricity with each other through a conductive material.

In accordance with the present invention, there is provided a structure of a flexible printed circuit board, which includes a substrate; a pair of lower flexible printed circuit boards facing each other at edges on the substrate and provided with anode pads and cathode pads that are mounted on end portions of both sides thereof; and a pair of upper flexible printed circuit boards facing each other at the edges on the substrate and provided with anode lead terminals and cathode lead terminals that are installed on end portions of both sides thereof to protrude in the length direction, wherein the anode lead terminals and the cathode lead terminals of the upper flexible printed circuit boards, which neighbors the lower flexible printed circuit boards, correspondingly overlap the anode pads and the cathode pads of the lower flexible printed circuit boards to conduct electricity with each other through a conductive material.

Figure 8:
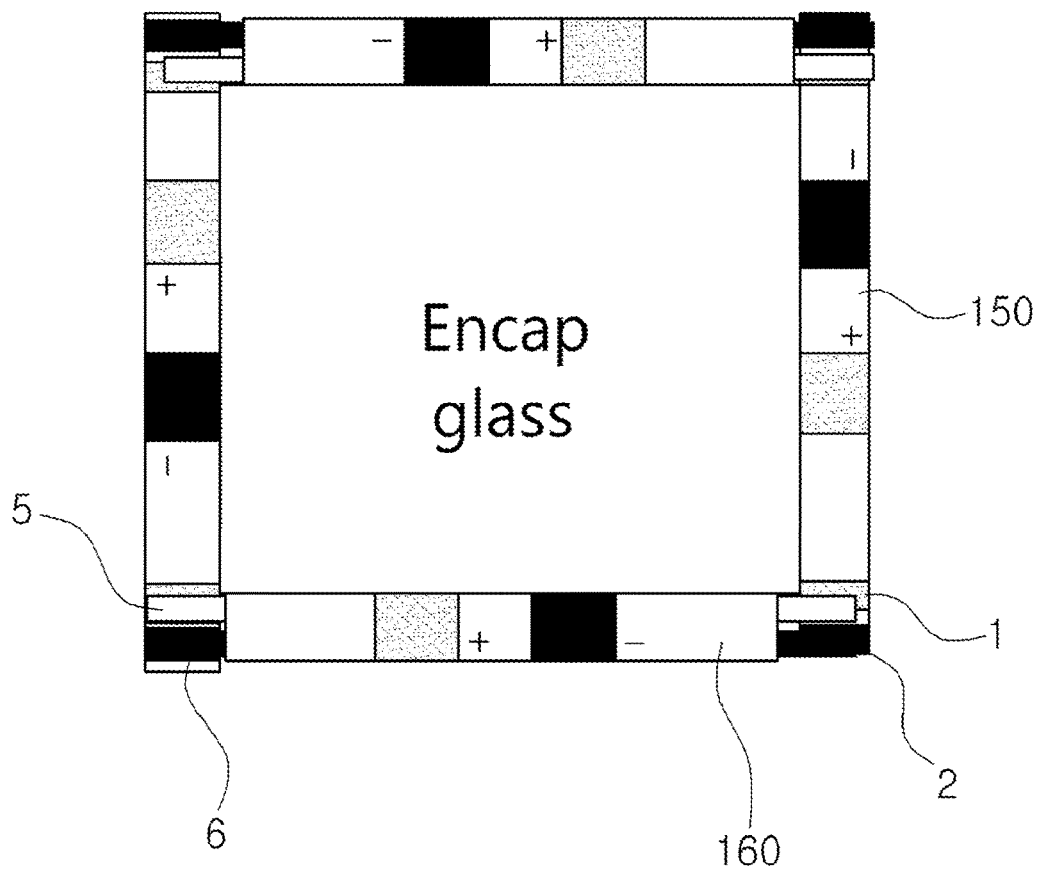
FIG. 8 is a diagram illustrating a structure of a flexible printed circuit board in accordance with other embodiment of the present invention.

As illustrated in FIG. 8, the anode lead terminal 5 and the cathode lead terminal 6 of the upper flexible printed circuit board 160, which neighbors the lower flexible printed circuit board 150, correspondingly overlaps the anode pad 1 and the cathode pad 2 of the lower flexible printed circuit board 150 to conduct electricity with each other through a conductive material.

In accordance with the present invention, the flexible printed circuit board may be a bar-type flexible printed circuit board.

In accordance with the present invention, the width of the flexible printed circuit board may be 1 to 5 mm.

In accordance with the present invention, the anode pad and the cathode pad mounted on the flexible printed circuit board may be in parallel to each other in a direction that is perpendicular to the length direction of the flexible printed circuit board.

In accordance with the present invention, the conductive material may be formed by soldering.

In accordance with the present invention, the solder used for soldering may be any one of brass solder, silver solder, german silver solder, manganese solder, gold solder, a lead-tin alloy, a lead-tin-zinc alloy, a lead-cadmium alloy, zinc-cadmium solder and a lead-tin-bismuth-based alloy.

In accordance with the present invention, the flexible printed circuit board may have a multilayer structure including two or more layers.

In accordance with the present invention, the anode lead terminal and the cathode lead terminal may protrude from an end portion of the outermost layer of the flexible printed circuit board in the length direction of the flexible printed circuit board.

As illustrated in FIG. 10, the upper flexible printed circuit board may have a multilayer structure, and the anode lead terminal and the cathode lead terminal may protrude from the end portion of the uppermost layer 180 of the upper flexible printed circuit board in the length direction of the flexible printed circuit board. In this case, the anode lead terminal and the cathode lead terminal may correspond to the protrusion in FIG. 10, and the anode lead terminal and the cathode lead terminal (i.e., protrusion), which are installed on the uppermost layer 180 of the upper flexible printed circuit board, may be positioned on the lower flexible printed circuit board 150 to overlap each other.

In accordance with the present invention, the flexible printed circuit board may further include an anisotropic conductive film positioned between the substrate and the flexible printed circuit board to correspond to the flexible printed circuit board.

In accordance with the present invention, there is provided a method for manufacturing a structure of a flexible printed circuit board, which includes 1) installing two or more flexible printed circuit boards at edges on a substrate; and 2) making the neighboring flexible printed circuit boards conduct electricity using at least one of soldering and wire bonding.

In accordance with the present invention, the term "edge on the substrate" means a border or an outer portion of one surface of the substrate.

In accordance with the present invention, the term "neighboring" means that one flexible printed circuit board and another flexible printed circuit board are located close to each other, and includes overlapping each other (i.e., piled up), in contact with each other, and spaced apart from each other.

The soldering method may be a typical method that is known in the art, but is not limited thereto.

The wire bonding method may be a typical method that is known in the art, but is not limited thereto.

In accordance with the present invention, the flexible printed circuit board may be a bar-type flexible printed circuit board.

In accordance with the present invention, the two or more flexible printed circuit boards may include four bar-type flexible printed circuit boards.

In accordance with the present invention, in the case where the substrate is rectangular, one bar-type flexible printed circuit board for one side may be arranged at an edge, that is, a border, on the substrate. In this case, total four bar-type flexible printed circuit boards may be installed on respective sides of the substrate.

In this case, end portions of the flexible printed circuit boards installed on four sides of the rectangular substrate may be arranged to overlap each other or to be spaced apart from each other.

In accordance with the present invention, the width of the flexible printed circuit board may be 1 to 5 mm.

In accordance with the present invention, the width of the soldering may be 0.1 to 2 mm.

In accordance with the present invention, the solder used for soldering may be any one of brass solder, silver solder, german silver solder, manganese solder, gold solder, a lead-tin alloy, a lead-tin-zinc alloy, a lead-cadmium alloy, zinc-cadmium solder and a lead-tin-bismuth-based alloy.

In accordance with the present invention, a wire that is used for wire bonding may have a diameter of 0.1 to 2 mm.

In accordance with the present invention, the method for manufacturing a structure of a flexible printed circuit board may further include installing an anisotropic conductive film in a position that corresponds to the flexible printed circuit board on the substrate before the step 1).

Specifically, after the anisotropic conductive film is installed at an edge on the substrate, two or more flexible printed circuit boards are installed on the anisotropic conductive film. Thereafter, the neighboring flexible printed circuit boards may be made to conduct electricity using at least one of soldering and wire bonding.

Figure 11:
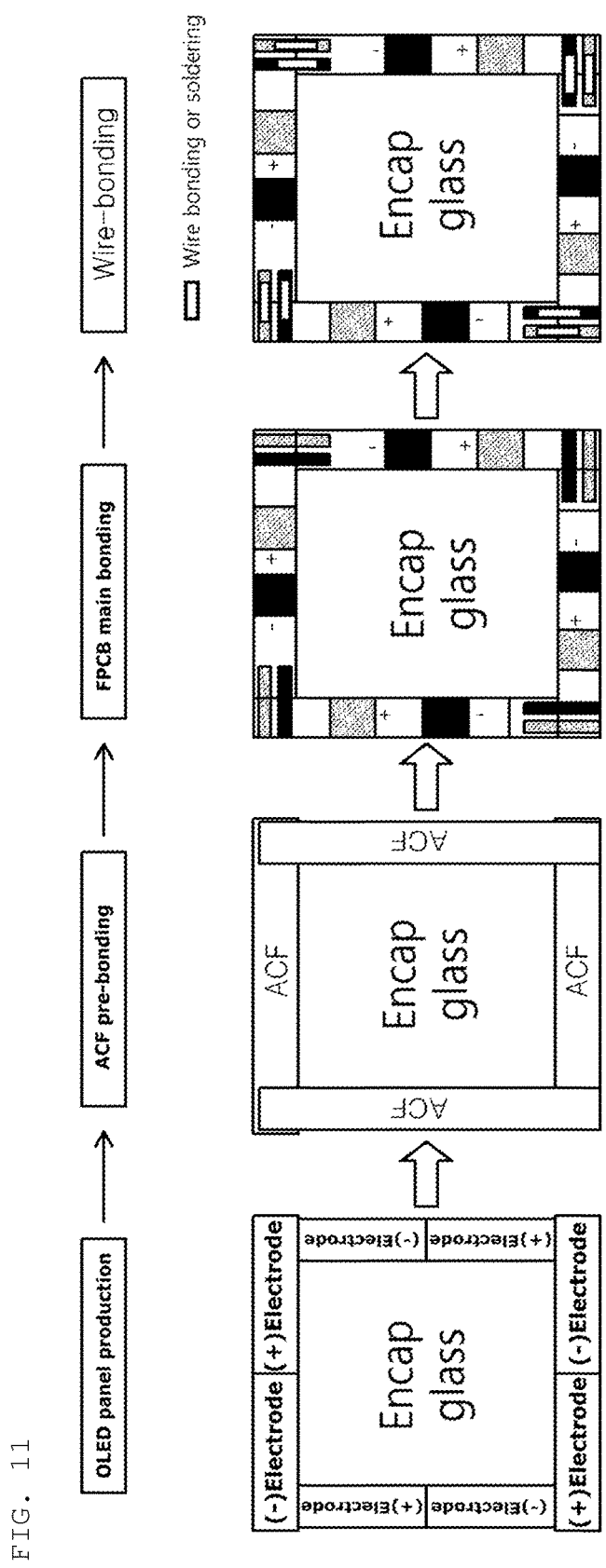
FIG. 11 is a diagram illustrating the manufacturing order of a structure of a flexible printed circuit board and an organic light emitting diode including the structure according to an embodiment of the present invention.

As illustrated in FIG. 11, specifically, after the anisotropic conductive film is installed at an edge on the substrate, two or more flexible printed circuit boards are installed on the anisotropic conductive film. Thereafter, the neighboring flexible printed circuit boards may be made to conduct electricity using at least one of soldering and wire bonding.

In accordance with the present invention, the two or more flexible printed circuit boards may not overlap each other. That is, the two or more flexible printed circuit boards may not be piled up.

In accordance with the present invention, the two or more flexible printed circuit boards may be spaced apart from each other. That is, the two or more flexible printed circuit boards may be distant from each other at a predetermined interval.

In this case, a gap distance between the flexible printed circuit boards may be longer than 0 mm and equal to or shorter than 1 mm.

In accordance with the present invention, anode pads and cathode pads are mounted on the two or more flexible printed circuit boards, and in step 2), the anode pads and the cathode pads, which are mounted on neighboring end portions of the flexible printed circuit boards, may be made to conduct electricity using at least one of soldering and wire bonding.

In this case, when the anode pads and the cathode pads, which are mounted on the neighboring end portions of the flexible printed circuit boards, are made to conduct electricity, the anode pads are connected to each other using at least one of soldering and wire bonding to conduct current, and the cathode pads are connected to each other using at least one of soldering and wire bonding to conduct current.

In accordance with the present invention, the anode pads and the cathode pads that are positioned on the end portions of the flexible printed circuit board may be mounted in parallel to each other. In this case, the direction in which the anode pads and the cathode pads are mounted is not specially limited so far as the anode pads and the cathode pads are positioned on the end portions of the flexible printed circuit board in parallel to each other.

In accordance with the present invention, the anode pads and the cathode pads that are positioned on the end portions of both sides of the flexible printed circuit board may be mounted in parallel to each other. In this case, the direction in which the anode pad and the cathode pad that are positioned on the end portion of one side of the flexible printed circuit board and the direction in which the anode pad and the cathode pad that are positioned on the end portion of the other side of the flexible printed circuit board may coincide with each other or may be different from each other.

In accordance with the present invention, the anode pad and the cathode pad that are mounted in parallel to each other on the end portion of any one of the two or more flexible printed circuit boards and the anode pad and the cathode pad that are mounted in parallel to each other on the end portions of another neighboring flexible printed circuit board may respectively conduct electricity through at least one of the soldering portion and the wire bonding portion.

In accordance with the present invention, the anode pad and the cathode pad that are positioned on the end portion of one side of the flexible printed circuit board may be mounted in parallel to each other in the length direction of the flexible printed circuit board, and the anode pad and the cathode pad that are positioned on the end portion of the other side of the flexible printed circuit board may be mounted in parallel to each other in a direction that is perpendicular to the length direction of the flexible printed circuit board.

In accordance with the present invention, in step 2), the anode pad and the cathode pad that are mounted in the length direction of the flexible printed circuit board on the end portion of any one of the two or more flexible printed circuit boards and the anode pad and the cathode pad that are mounted in a direction that is perpendicular to the length direction of the flexible printed circuit board on the end portions of another neighboring flexible printed circuit board may respectively conduct electricity using at least one of soldering and wire bonding.

In accordance with the present invention, the step 1) may be a step of installing a pair of lower flexible printed circuit boards facing each other at edges on the substrate and mounted with anode pads and cathode pads, and a pair of upper flexible printed circuit boards facing each other at the edges on the substrate to partially overlap the lower flexible printed circuit boards and mounted with anode pads and cathode pads, and the step 2) may be a step of forming a hole in a portion of the upper flexible circuit board that overlaps the lower flexible printed circuit board, and making the anode pads and the cathode pads of the upper flexible printed circuit boards and the anode pads and the cathode pads of the lower flexible printed circuit boards, which overlap each other, conduct electricity by solder that fills a hole through soldering.

In accordance with the present invention, the step 1) may install the pairs of the lower and upper flexible printed circuit boards so that an end portion of the upper flexible printed circuit board overlaps an end portion of the lower flexible printed circuit board.

In accordance with the present invention, the hole may be formed at the anode pad and the cathode pad of the upper flexible printed circuit board.

In accordance with the present invention, the diameter of the hole may be equal to or smaller than the width of the anode pad and the cathode pad.

In accordance with the present invention, the distance between the center of the hole of the anode pad and the center of the hole of the anode pad may be 0.5 to 2 mm.

In accordance with the present invention, the upper flexible printed circuit board and the lower flexible printed circuit board may have a multilayer structure including two or more layers.

In accordance with the present invention, the outermost layer of the upper flexible printed circuit board may be installed to extend in the length direction of the upper flexible printed circuit board, and may be positioned on the lower flexible printed circuit board so that an end portion of the outermost layer of the upper flexible printed circuit board overlaps the lower flexible printed circuit board.

In accordance with the present invention, an anode lead terminal and a cathode lead terminal are installed on an end portion of one side of the flexible printed circuit board to protrude in a length direction of the flexible printed circuit board, an anode pad and a cathode pad are mounted on an end portion of the other side of the flexible printed circuit board, and in step 2), the anode lead terminal and the cathode lead terminal of any one of the flexible printed circuit boards correspondingly overlap the anode pad and the cathode pad of the end portion of another neighboring flexible printed circuit boards to conduct electricity with each other by soldering.

In accordance with the present invention, the step 1) may be a step of installing a pair of lower flexible printed circuit boards facing each other at edges on the substrate and having anode pads and cathode pads mounted on end portions of both sides thereof, and a pair of upper flexible printed circuit boards facing each other at the edges on the substrate and having an anode lead terminal and a cathode lead terminal installed to protrude in the length direction on the end portions of both sides thereof, and the step 2) may be a step of making the anode lead terminal and the cathode lead terminal of the upper flexible printed circuit board correspondingly overlap the anode pad and the cathode pad of the lower flexible printed circuit board to conduct electricity with each other by soldering.

In accordance with the present invention, the flexible printed circuit board may have a multilayer structure including two or more layers.

In accordance with the present invention, the anode lead terminal and the cathode lead terminal may protrude in the length direction of the flexible printed circuit board on the end portion of the outermost layer of the flexible printed circuit board.

In the method for manufacturing the flexible printed circuit board, explanation of the duplicate configuration of the structure of the flexible printed circuit board is quotable in the same manner.

In accordance with the present invention, there is provided a display device including the structure of the flexible printed circuit board as described above.

The display device may be any one of a plasma display panel (PDP), a touch panel, a light emitting diode (LED), an organic light emitting diode (OLED), a liquid crystal display (LCD), a thin film transistor-liquid crystal display (LCD-TFT), and a cathode ray tube (CRT).

In accordance with the present invention, there is provided an organic light emitting diode including the structure of the flexible printed circuit board.

In the organic light emitting diode, explanation of the duplicate configuration of the structure of the flexible printed circuit board is quotable in the same manner.

In accordance with the present invention, there is provided an organic light emitting diode, which includes a substrate that includes a display portion for displaying an image and a non-display portion positioned on an outer side thereof; two or more flexible printed circuit boards positioned in the non-display portion; and at least one of a soldering portion and a wire bonding portion which make the neighboring flexible printed circuit boards conduct electricity.

In accordance with the present invention, the flexible printed circuit board may be a bar-type flexible printed circuit board.

In accordance with the present invention, the two or more flexible printed circuit boards may include four bar-type flexible printed circuit boards.

In accordance with the present invention, the width of the flexible printed circuit board may be 1 to 5 mm.

In accordance with the present invention, the width of the soldering portion may be 0.1 to 2 mm.

In accordance with the present invention, the soldering portion may include any one of brass solder, silver solder, german silver solder, manganese solder, gold solder, a lead-tin alloy, a lead-tin-zinc alloy, a lead-cadmium alloy, zinc-cadmium solder and a lead-tin-bismuth-based alloy.

In accordance with the present invention, the wire bonding portion may include a wire having a diameter of 0.1 to 2 mm.

In accordance with the present invention, the organic light emitting diode may further include an anisotropic conductive film positioned between the substrate and the flexible printed circuit board to correspond to the flexible printed circuit board.

Figure 12:
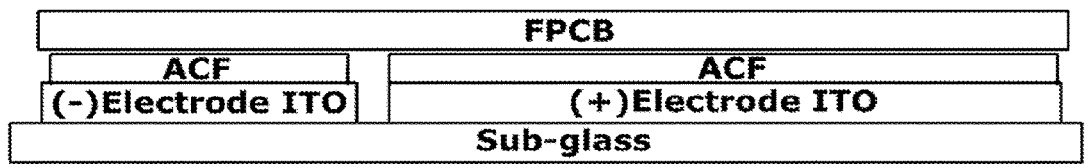
FIG. 12 is a side view illustrating an organic light emitting diode including a structure of a flexible printed circuit board according to an embodiment of the present invention.

As illustrated in FIG. 12, the organic light emitting diode may further include an anisotropic conductive film positioned between the substrate and the flexible printed circuit board to correspond to the flexible printed circuit board.

The anisotropic conductive film is used as a material that conducts electricity as the flexible printed circuit board is adhered to the substrate, and is in a double-sided tape state in which adhesives that are cured by heat and fine conductive balls are mixed. If high-temperature pressure is applied to the anisotropic conductive film, the conductive balls in a portion that comes in contact with the pads of the circuit pattern are broken, and the broken conductive balls achieve conduction between the pads while the adhesives are cured in portions except for the pad portions to achieve adhesion to each other. The anisotropic conductive film adhered as described above has conductivity in the thickness direction to conduct electricity and has insulation in the horizontal direction.

In accordance with the present invention, the two or more flexible printed circuit boards may not overlap each other.

In accordance with the present invention, the two or more flexible printed circuit boards may be spaced apart from each other.

In accordance with the present invention, a gap distance between the flexible printed circuit boards may be longer than 0 mm and equal to or shorter than 1 mm.

In accordance with the present invention, the anode pads and the cathode pads may be mounted on the two or more flexible printed circuit boards, and the soldering portion and the wire bonding portion may make the anode pads and the cathode pads mounted on neighboring portions of the flexible printed circuit boards conduct electricity.

In accordance with the present invention, the anode pads and the cathode pads that are positioned on the end portions of the flexible printed circuit board may be mounted in parallel to each other.

In accordance with the present invention, the anode pad and the cathode pad that are positioned on the end portion of one side of the flexible printed circuit board may be mounted in parallel to each other in the length direction of the flexible printed circuit board, and the anode pad and the cathode pad that are positioned on the end portion of the other side of the flexible printed circuit board may be mounted in parallel to each other in a direction that is perpendicular to the length direction of the flexible printed circuit board.

In accordance with the present invention, the anode pad and the cathode pad that are mounted in the length direction of the flexible printed circuit board on the end portion of any one of the two or more flexible printed circuit boards and the anode pad and the cathode pad that are mounted in a direction that is perpendicular to the length direction of the flexible printed circuit board on the end portions of another neighboring flexible printed circuit board may respectively conduct electricity through at least one of the soldering portion and the wire bonding portion.

In accordance with the present invention, the two or more flexible printed circuit boards may include a pair of lower flexible printed circuit boards facing each other in the non-display portion and mounted with anode pads and cathode pads, and a pair of upper flexible printed circuit boards facing each other in the non-display portion to partially overlap the lower flexible printed circuit boards, and mounted with anode pads and cathode pads, wherein the anode pads and the cathode pads of the overlapping upper flexible printed circuit boards and the anode pads and the cathode pads of the lower flexible printed circuit boards respectively conduct electricity by the soldering portion which fills a hole formed in a portion of the upper flexible circuit board that overlaps the lower flexible printed circuit board.

In accordance with the present invention, an end portion of the upper flexible printed circuit board may overlap an end portion of the lower flexible printed circuit board.

In accordance with the present invention, the hole may be formed at the anode pad and the cathode pad of the upper flexible printed circuit board.

In accordance with the present invention, the diameter of the hole may be equal to or smaller than the width of the anode pad and the cathode pad.

In accordance with the present invention, the distance between the center of the hole of the anode pad and the center of the hole of the cathode pad may be 0.5 to 2 mm.

In accordance with the present invention, the upper flexible printed circuit board and the lower flexible printed circuit board may have a multilayer structure including two or more layers.

In accordance with the present invention, the outermost layer of the upper flexible printed circuit board may be installed to extend in the length direction of the upper flexible printed circuit board, and may be positioned on the lower flexible printed circuit board so that an end portion of the outermost layer of the upper flexible printed circuit board overlaps the lower flexible printed circuit board.

In accordance with the present invention, an anode lead terminal and a cathode lead terminal are installed on an end portion of one side of the flexible printed circuit board to protrude in the length direction of the flexible printed circuit board, an anode pad and a cathode pad are mounted on an end portion of the other side of the flexible printed circuit board, and the anode lead terminal and the cathode lead terminal of any one of the flexible printed circuit boards correspondingly overlap the anode pad and the cathode pad of the end portion of another neighboring flexible printed circuit boards to conduct electricity with each other by the soldering portion.

In accordance with the present invention, the two or more flexible printed circuit boards may include a pair of lower flexible printed circuit boards facing each other in the non-display portion and having anode pads and cathode pads mounted on end portions of both sides thereof, and a pair of upper flexible printed circuit boards facing each other in the non-display portion and having an anode lead terminal and a cathode lead terminal installed to protrude from the end portions of both sides thereof in the length direction thereof, wherein the anode lead terminal and the cathode lead terminal of any one of the flexible printed circuit boards correspondingly overlap the anode pad and the cathode pad on the end portion of another neighboring flexible printed circuit boards to conduct electricity with each other by the soldering portion.

In accordance with the present invention, the flexible printed circuit board may have a multilayer structure including two or more layers.

In accordance with the present invention, the anode lead terminal and the cathode lead terminal may protrude in the length direction of the flexible printed circuit board on the end portion of the outermost layer of the flexible printed circuit board.

DESCRIPTION OF REFERENCE NUMERALS IN THE DRAWING

1: anode pad
2: cathode pad
5: anode lead terminal
6: cathode lead terminal
10: insulating film base material
20: anode portion
25: cathode portion
30: soldering portion or wire bonding portion
50: hole
100: flexible printed circuit board
150: lower flexible printed circuit board
160: upper flexible printed circuit board
180: uppermost layer of an upper flexible printed circuit board

The invention claimed is:

1. A display device comprising:
a display panel including a substrate having a display portion and non-display portion positioned on an outer side of the display portion, and
a structure of a flexible printed circuit board positioned in the non-display area,
wherein the structure of a flexible printed circuit board comprising two or more flexible printed circuit boards positioned at edges on the substrate and mounted with anode pads and cathode pads, the two or more flexible printed circuit boards including a first flexible printed circuit board and a second flexible printed circuit board,
wherein at least one of a soldering portion and a wire bonding portion which respectively make the anode pads and the cathode pads mounted on neighboring end portions of the first and second flexible printed circuit boards conduct electricity,
wherein a first end of the at least one of a soldering portion and a wire bonding portion is connected with the anode pad or the cathode pad of the first flexible printed circuit board, and a second end of the at least one of a soldering portion and a wire bonding portion is connected with the anode pad or the cathode pad of the second flexible printed circuit board, and
wherein the first flexible printed circuit board has an end portion and the second flexible printed circuit board has an end portion, the end portion of the first flexible printed circuit board overlaps the end portion of the second flexible printed circuit board, and the at least one of a soldering portion and a wire bonding portion overlaps each of the end portion of the first flexible printed circuit board and the end portion of the second flexible printed circuit board.

2. The display device of claim 1, wherein the display device is any one of a plasma display panel (PDP), a touch panel, a light emitting diode (LED), an organic light emitting diode (OLED), a liquid crystal display (LCD), a thin film transistor-liquid crystal display (LCD-TFT), and a cathode ray tube (CRT).

3. The display device of claim 1, wherein the two or more flexible printed circuit board are a bar-type flexible printed circuit boards.

4. The display device of claim 1, wherein the two or more flexible printed circuit boards include four bar-type flexible printed circuit boards.

5. The display device of claim 1, wherein a width of the flexible printed circuit board is 1 to 5 mm.

6. The display device of claim 1, wherein the anode pads and the cathode pads that are positioned on the end portions of the flexible printed circuit board are mounted in parallel to each other.

7. The display device of claim 1, wherein the anode pads and the cathode pads that are positioned on the end portions of one side of the flexible printed circuit board are mounted in parallel to each other in a length direction of the flexible printed circuit board, and
the anode pads and the cathode pads that are positioned on the end portions of the other side of the flexible printed circuit board are mounted in parallel to each other in a direction that is perpendicular to the length direction of the flexible printed circuit board.

8. The display device of claim 7, wherein the anode pad and the cathode pad that are mounted in the length direction of the flexible printed circuit board on the end portion of any one of the two or more flexible printed circuit boards and the anode pad and the cathode pad that are mounted in the direction that is perpendicular to the length direction of the flexible printed circuit board on the end portion of another neighboring flexible printed circuit board respectively conduct electricity through at least one of the soldering portion and the wire bonding portion.

9. The display device of claim 1, wherein a width of the soldering portion is 0.1 to 2 mm.

10. The display device of claim 1, wherein the soldering portion includes any one of brass solder, silver solder, german silver solder, manganese solder, gold solder, a lead-tin alloy, a lead-tin-zinc alloy, a lead-cadmium alloy, zinc-cadmium solder and a lead-tin-bismuth-based alloy.

11. The display device of claim 1, wherein the wire bonding portion has a diameter of 0.1 to 2 mm.

12. The display device of claim 1, further comprising an anisotropic conductive film positioned between the substrate and the flexible printed circuit board to correspond to the flexible printed circuit board.

* * * * *